(12) United States Patent
Lu et al.

(10) Patent No.: US 9,442,384 B2
(45) Date of Patent: Sep. 13, 2016

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 149 days.

(21) Appl. No.: 14/206,516

(22) Filed: Mar. 12, 2014

(65) Prior Publication Data

US 2014/0268086 A1  Sep. 18, 2014

Related U.S. Application Data

(60) Provisional application No. 61/779,973, filed on Mar. 13, 2013.

(51) Int. Cl.
*G03B 27/72* (2006.01)
*G03F 7/20* (2006.01)

(52) U.S. Cl.
CPC ....... *G03F 7/70191* (2013.01); *G03F 7/70091* (2013.01)

(58) Field of Classification Search
CPC .......................... G03F 7/70191; G03F 7/70091
See application file for complete search history.

(56) References Cited

U.S. PATENT DOCUMENTS

| | | | | |
|---|---|---|---|---|
| 5,863,712 A * | 1/1999 | Von Bunau | ....... | G03F 7/070125 355/53 |
| 6,261,727 B1 * | 7/2001 | Wang | ................. | G03F 7/70308 355/55 |
| 6,333,780 B1 * | 12/2001 | Tsukuda | ................ | G02B 27/46 349/4 |
| 6,632,574 B1 * | 10/2003 | Sugita | ..................... | G03F 1/144 430/311 |
| 6,821,682 B1 | 11/2004 | Sterns et al. | | |
| 8,628,897 B1 | 1/2014 | Lu et al. | | |
| 2003/0133099 A1 * | 7/2003 | Shiode | .............. | G01M 11/0264 356/124 |
| 2004/0174506 A1 * | 9/2004 | Smith | .................... | G03F 7/706 355/52 |
| 2005/0219515 A1 * | 10/2005 | Morohoshi | ............. | G03F 7/706 356/124 |
| 2005/0287483 A1 * | 12/2005 | Lercel | .................... | G03F 1/144 430/394 |
| 2007/0177123 A1 * | 8/2007 | Tel | ......................... | G03B 27/42 355/69 |
| 2007/0209029 A1 * | 9/2007 | Ivonin | ................. | G03F 7/70191 430/311 |
| 2008/0137981 A1 * | 6/2008 | Tawarayama | ....... | G03F 7/70641 382/255 |
| 2008/0204690 A1 * | 8/2008 | Berger | ............... | G03F 7/70216 355/67 |
| 2008/0318138 A1 | 12/2008 | Holfeld | | |
| 2009/0053618 A1 * | 2/2009 | Goehnermeier | ........ | G03F 7/701 430/5 |
| 2009/0213354 A1 * | 8/2009 | Sandstrom | ............. | G03F 7/701 355/71 |
| 2010/0141925 A1 * | 6/2010 | Cao | ......................... | G03F 7/705 355/77 |
| 2011/0020737 A1 * | 1/2011 | Kamo | ................... | B82Y 10/00 430/5 |
| 2012/0249988 A1 * | 10/2012 | Runde | ................. | G03F 7/70108 355/67 |
| 2014/0078479 A1 * | 3/2014 | McIntyre | ............ | G03F 7/70125 355/67 |

FOREIGN PATENT DOCUMENTS

WO      WO 00/34828      6/2000

* cited by examiner

*Primary Examiner* — Deoram Persaud
(74) *Attorney, Agent, or Firm* — Haynes and Boone, LLP

(57) ABSTRACT

The present disclosure is directed towards lithography processes. In one embodiment, a patterned mask is provided. An information of a position of diffraction light (PDL) on a pupil plane of a projection optics box (POB) is used to define as a light-transmitting region of a pupil filter. The patterned mask is exposed by an on-axis illumination (ONI) with partial coherence σ less than 0.3. The pupil filter is used to transmit diffraction light to a target.

20 Claims, 5 Drawing Sheets

EXTREME ULTRAVIOLET LITHOGRAPHY PROCESS AND MASK

This patent claims the benefit of U.S. Ser. No. 61/779,973 filed Mar. 13, 2013, which is hereby incorporated by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for very small semiconductor technology nodes, such as 14-nm, and beyond. EUV lithography is very similar to optical lithography in that it needs a mask to print wafers, except that it employs light in the EUV region, i.e., at about 13.5 nm. At the wavelength of 13.5 nm, most materials are highly absorbing. Thus, reflective optics, rather than refractive optics, are commonly used in EUV lithography. Although existing methods of EUV lithography have been generally adequate for their intended purposes, they have not been entirely satisfactory in all respects. For example, the detrimental effect of mask errors (and resulting errors on the substrate) is magnified. It is desired to reduce the number of errors on a mask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
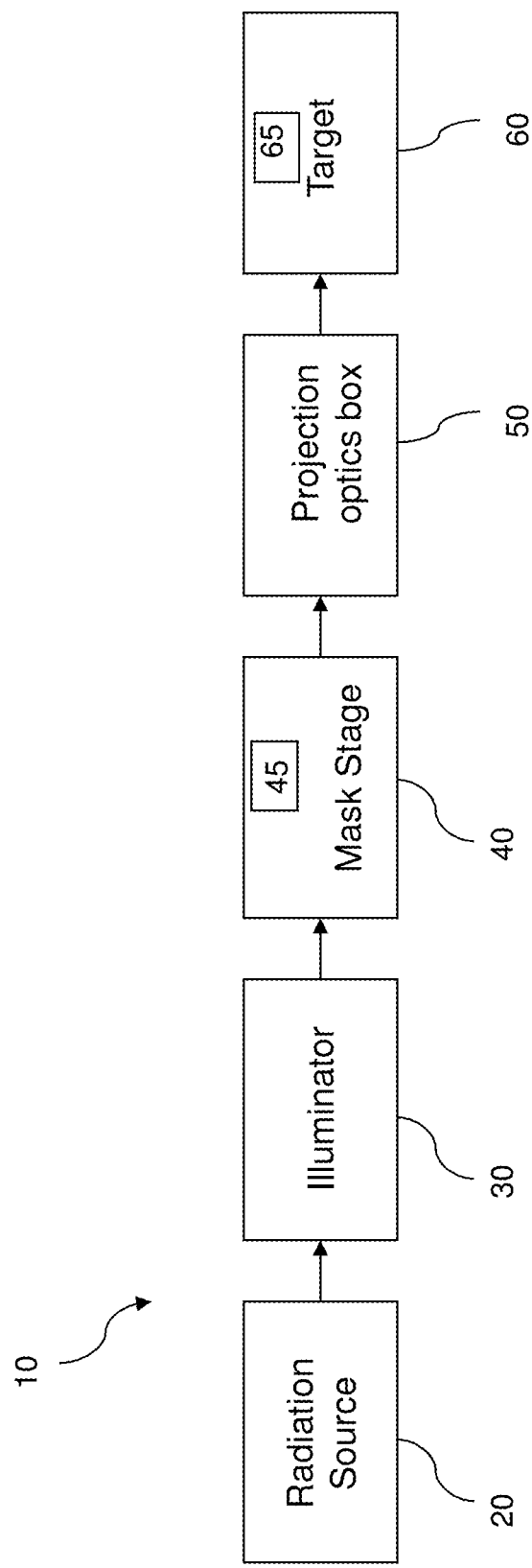
FIG. 1 is a block diagram of a lithography process for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography system 10 that may benefit from one or more embodiments of the present invention is disclosed. The lithography system 10 is also illustrated, in portion, in a schematic view. In the present embodiment, the lithography system 10 is an extreme ultraviolet (EUV) lithography system designed to expose a resist layer by EUV. The resist layer is sensitive to the EUV radiation. The EUV lithography system 10 employs a radiation source 20 to generate EUV light, such as EUV light having a wavelength ranging between about 1 nm and about 100 nm. In one particular example, the EUV radiation source 20 generates a EUV light with a wavelength centered at about 13.5 nm.

The EUV lithography system 10 also employs an illuminator 30. In various embodiments, the illuminator 30 includes various refractive optic components, such as a single lens or a lens system having multiple lenses (zone plates) or reflective optics, such as a single mirror or a mirror system having multiple mirrors in order to direct light from the radiation source 30 onto a mask 45. In the present embodiment where the radiation source 30 that generates light in the EUV wavelength range, reflective optics are employed. Refractive optics, however, can also be realized by zoneplates for example. In the present embodiment, the illuminator 30 is operable to configure the mirrors to provide an on-axis illumination (ONI) to illuminate the mask 45. In one example, the mirrors of the illuminator 30 are switchable to reflect EUV light to different illumination positions. In another embodiment, a stage prior to the illuminator 30 may additionally include other switchable mirrors that are controllable to direct the EUV light to different illumination positions with the mirrors of the illuminator 30. Accordingly, the lithography system 10 is able to achieve different illumination modes without sacrificing the illumination energy.45. In one embodiment, a disk illuminator 30 with partial coherence σ being at most 0.3 generated by the illuminator 30 is employed. In another embodiment, a dipole illuminator 30 with partial coherence σ being at most 0.3 is employed.

The EUV lithography system 10 also includes a mask stage 35 configured to secure a photomask 45 (in the present disclosure, the terms of mask, photomask, and reticle are used to refer to the same item). The mask 36 may be a transmissive mask or a reflective mask. In the present embodiment, the mask 36 is a reflective mask such as described in further detail below.

The structure of the mask 45 and the method making the same will be further described later according to various embodiments. The mask fabrication process includes two operations: a blank mask fabrication process and a mask patterning process. During the blank mask fabrication process, a blank mask is formed by deposing suitable layers (e.g., multiple reflective layers) on a suitable substrate. The blank mask is patterned during the mask patterning process to have a design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. Several masks (for example, a set of 15 to 30 masks) may be used to construct a complete IC. In general, various masks are fabricated for being used in various processes.

In general, various masks are fabricated for use in various processes. Types of EUV masks include binary intensity masks (BIM) and phase-shifting masks (PSM). An example BIM includes an almost totally absorptive region (also referred to as a dark region) and a reflective region. In the opaque region, an absorber is present and an incident light is almost fully absorbed by the absorber. In the reflective region, the absorber is removed and the incident light is diffracted by a multilayer (ML). A PSM includes an absorptive region and a reflective region. The phase difference (generally) 180° between a portion of a light diffracted from the absorptive region and a portion of the light diffracted from the reflective region enhances resolution and image quality. The PSM can be an attenuated PSM (AttPSM) or an alternating PSM (AltPSM). An AttPSM usually has a reflectivity of 2%-15% from its absorber, while an AltPSM usually has a reflectivity of larger than 50% from its absorber.

Figure 2:
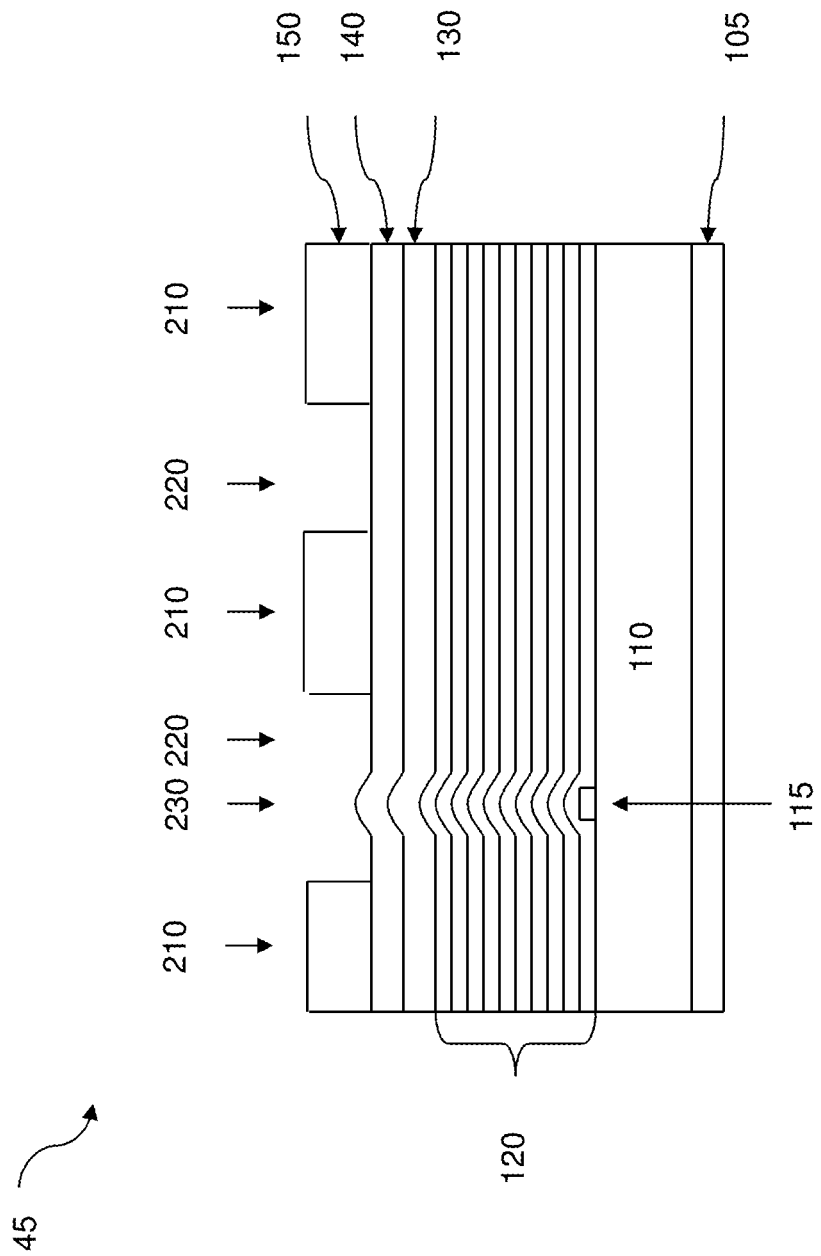
FIG. 2 is a diagrammatic cross-sectional view of various aspects of one embodiment of an EUV mask at various stages of a lithography process constructed according to aspects of the present disclosure.

One example of the mask 45 is shown in FIG. 2. The mask 45 is an EUV mask, and includes a substrate 110 made of low thermal expansion material (LTEM). The LTEM material may include $TiO_2$ doped $SiO_2$, and/or other low thermal expansion materials known in the art. In addition, a conductive layer 105 is disposed under (as shown in the figure) the LTEM substrate 110 for the electrostatic chucking purpose. In an embodiment, the conductive layer 105 includes chromium nitride (CrN), though other compositions are possible. The EUV mask 45 includes a reflective multilayer (ML) 120 disposed over the LTEM substrate 110. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any material that is highly reflective at EUV wavelengths can be utilized for the ML 120. The thickness of each layer of the ML 120 depends on the EUV wavelength and the incident angle. The thickness of the ML 120 is adjusted to achieve a maximum constructive interference of the EUV light diffracted at each interface and a minimum absorption of the EUV light by the ML 120. The ML 120 may be selected such that it provides a high reflectivity to a selected radiation type/wavelength. The EUV mask 45 also includes a capping layer 130 disposed above the ML 120 to prevent oxidation of the ML. In one embodiment, the capping layer 130 includes silicon with about 4-7 nm thickness. The EUV mask 45 further includes a buffer layer 140 disposed above the capping layer 130 to act as an etching stop layer in a patterning or repairing process of an absorption layer, which will be described later. The buffer layer 140 has different etching characteristics from the absorption layer. The buffer layer 140 includes ruthenium (Ru), Ru compounds such as RuB, RuSi, chromium (Cr), Cr oxide, and Cr nitride. The EUV mask 45 also includes an absorption layer 150 formed above the buffer layer 140. In the present embodiment, the absorption layer 150 absorbs radiation in the EUV wavelength range projected onto a patterned mask. The absorption layer 150 includes multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above.

In the present example, the mask 45 includes one or more defects 115. The defect 115 may be a bump (protrusion) or a pit (depression) on the surface of the LTEM substrate 110 (beneath the ML 120) or embedded in the ML 120. The defect 115 may be created during fabricating the LTEM substrate 110, the ML 120, or any other process. For the sake of example, the defect 115 is a bump and has a height of about one fourth of the wavelength of the radiation source 20. In the present example, the defect 115 causes local deformation of all subsequent layers above it.

The absorption layer 150 is patterned to form the design layout pattern EUV mask 45. In one embodiment, the EUV mask 45 is formed with one dimension patterns. In another embodiment, the EUV mask 45 is formed with more than one dimension patterns. The EUV mask 45 has a first region 210 and a second region 220. The absorption layer 150 is removed from the second region 220, referred to as a reflective region, while it remains in the first region 210, referred to as an absorptive region. In one embodiment, at least one of the reflective regions 220 includes a phase-defect region 230. The phase-defect region 230 is due to the presence of the defect 115 beneath or embedded in the ML 120. The phase-defect region 230 may have a small impact on the amplitude of a light diffracted from the reflective region 220 where the phase-defect region 230 is located. However, it can have large impact on the phase of the light. In fact, a relatively small phase error, e.g., 20°, can have a prominent impact on the lithographic process window or even cause patterning fidelity problems. Therefore, a defect-free LTEM substrate 110 and a defect-free ML 120 are desired. However, this puts constraints in a mask fabrication and may make the mask fabrication become more expensive. The depicted disclosure presents an approach to reduce impacts of phase defects.

Referring again to FIG. 1, the EUV lithography system 10 also employs the POB 50 for imaging the pattern of the mask 45 on to a target 65 (such as a semiconductor wafer) secured on a substrate stage 60 of the lithography system 10. The POB 50 may have refractive optics and/or reflective optics. The radiation diffracted from the mask 45 (e.g., a patterned radiation) is collected by the POB 50. The POB 50 also includes a pupil filter 51 placed at optics pupil plane to control the light intensity distribution diffracted from the mask 45. The pupil filter 51 has a plurality of light-transmitting regions 51A to transmit light diffracted from the mask 45 to the target 65, such as a wafer, and a plurality of opaque regions 51B to block light diffracted from the mask 45 thereby from transmitting through. In the present embodiment, the pupil filter 51 may employ various of patterns, such as shown in FIGS. 3A to 3C, to block targeted light diffracted from the mask 45, which will be described in further detail below.

In the present embodiment, the target 65 is a semiconductor wafer with a photosensitive layer (e.g., photoresist or resist), which is sensitive to the EUV radiation. The target 65 may be held by a target substrate stage 60. The target substrate stage 60 provides control of the target substrate position such that the image of the mask is scanned onto the target substrate in a repetitive fashion (though other lithography methods are possible).

Figure 4:
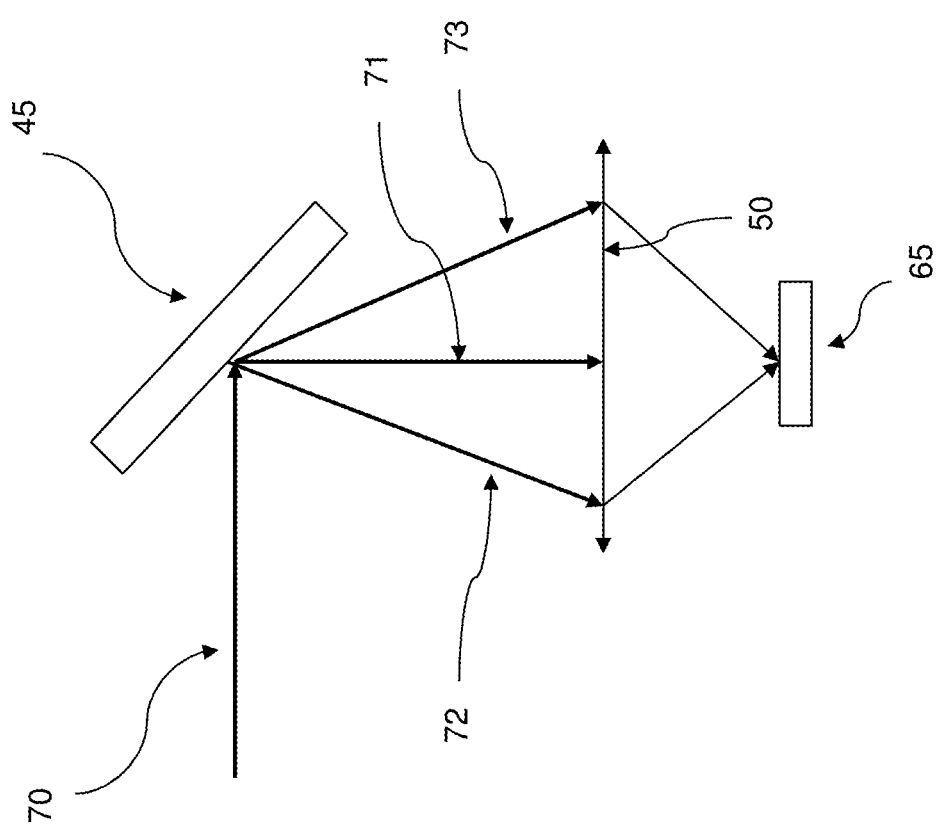
FIG. 4 is a diagrammatic perspective view of a projection optics box (POB) employed in the lithography process for implementing one or more embodiments of the present disclosure. Since a POB by reflective optics is difficult to sketch, the equivalent refractive optics is used to illustrate the underlying principle.

Referring to FIG. 4, an incident light ray 70, after being reflected from the mask 45, is diffracted into various diffraction orders due to the presence of mask patterns, such as a 0-th diffraction order ray 71, a −1-st diffraction order ray 72, a +1-st diffraction order ray 73 and other higher diffraction order rays (not shown in the figure). In present embodiment, the non-diffracted light rays 71 are mostly (e.g., more than 70%) removed by the pupil filter 51 in the POB 50. An information of a position of diffraction light (PDL) on the pupil plane is provided and used to define the light-transmitting regions 51A of the pupil filter 51 while rest regions of the pupil filter 51 are set to be the opaque regions 51B. In another embodiment, the light-transmitting region 51A of the pupil filter 51 is further defined by an additional area surrounding the PDL. The PDL on the pupil plane can be calculated by the convolution of Fourier transformation of mask patterns and illumination distribution, known in the art.

Figure 5:
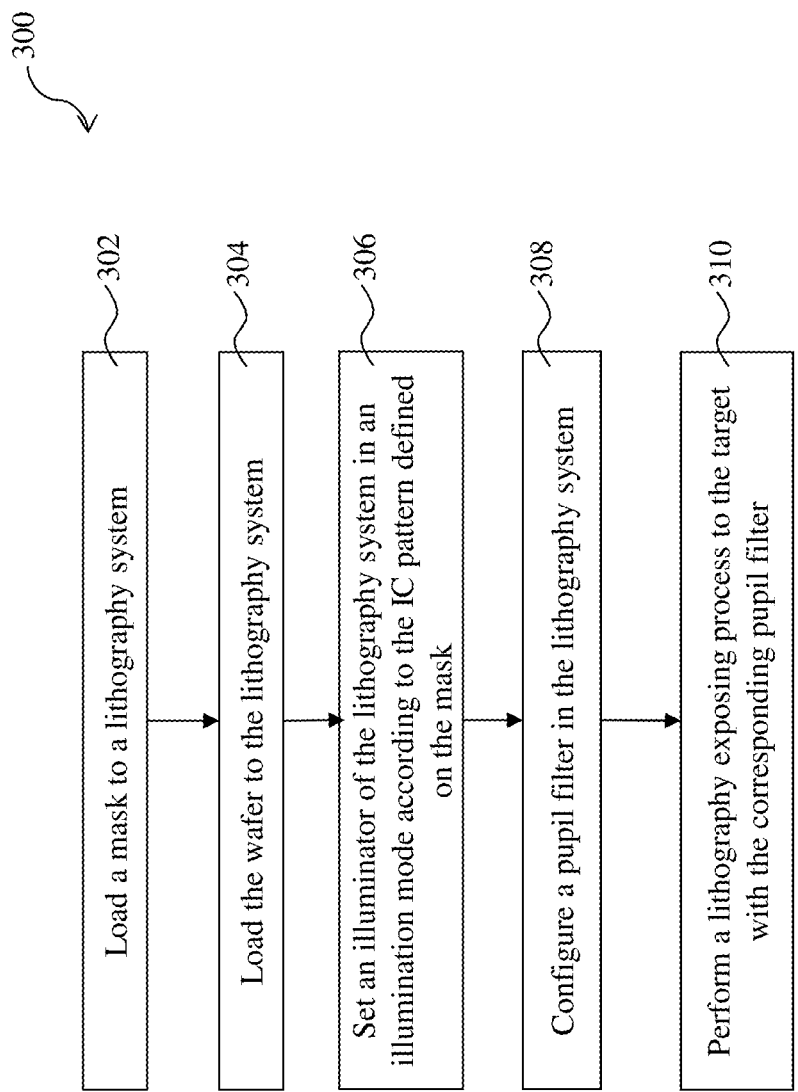
FIG. 5 is a flowchart of a lithography process constructed in accordance with some embodiments.

FIG. 5 is a flowchart of a method 300 of performing a lithography process in an integrated circuit fabrication constructed according to aspects of the present disclosure in various embodiments.

Referring to FIG. 5, the method 300 includes an operation 302 by loading to the lithography system 10 with the mask 45. The operation 302 in the method 300 may further include other steps, such as alignment after the mask 45 is secured on the mask stage 40.

Referring to FIG. 5, the method 300 also includes an operation 304 to load a target 655 to the substrate stage 60 of the lithography system 10. In the present embodiment, the target 65 is a semiconductor substrate, such as a silicon wafer. The target 65 is coated with a resist layer that is sensitive to the EUV light. The resist layer is to be patterned by a lithography exposure process such that the IC design layout (IC pattern) of the mask 45 is transferred to the resist layer.

Figure 3:
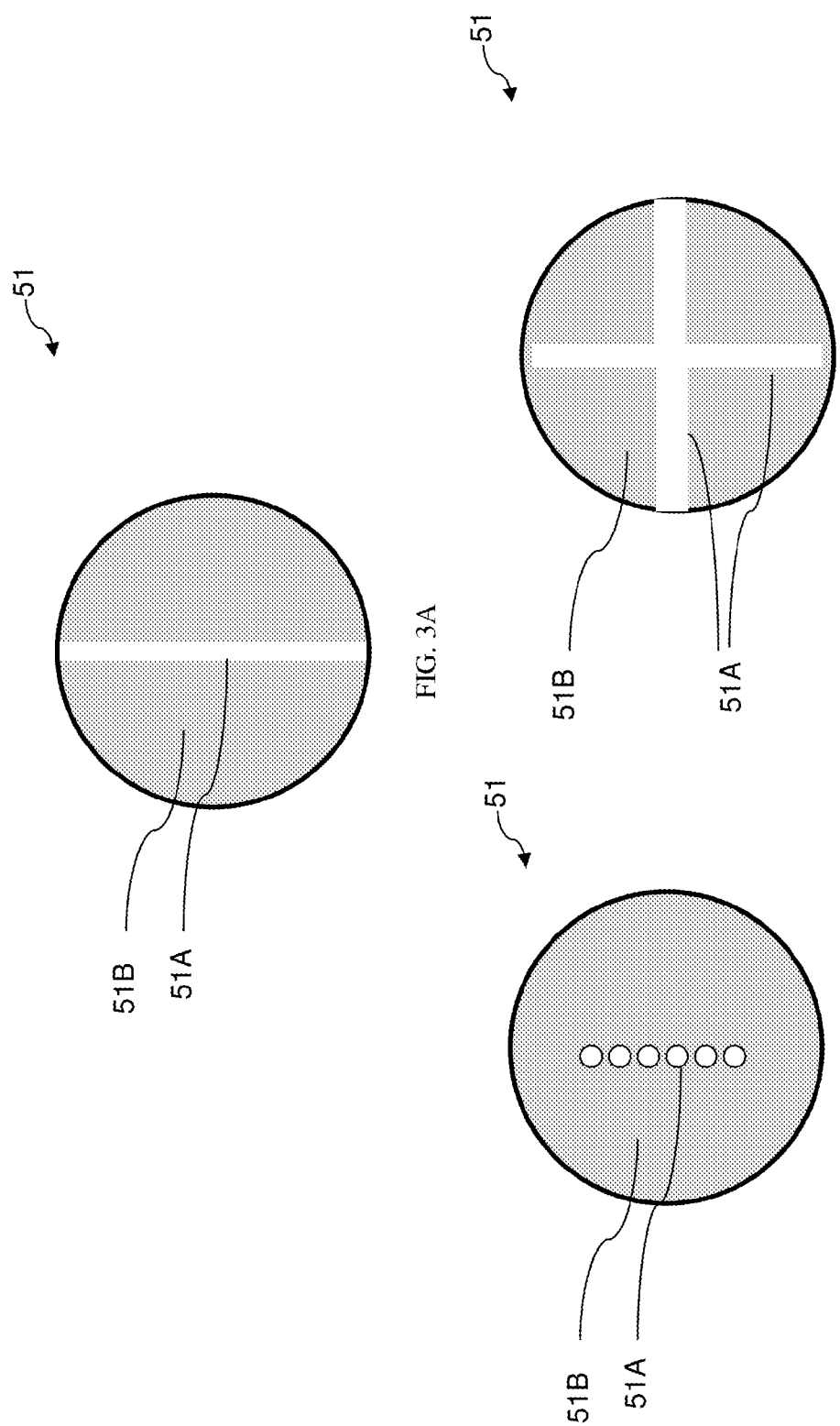
FIGS. 3A to 3C are diagrammatic top views of a pupil filter employed in the lithography process for implementing one or more embodiments of the present disclosure.

Referring to FIG. 5, the method 300 also includes an operation 306 by setting the illuminator 30 of the lithography system 10 in a highly coherent illumination mode. In the present embodiment, an on-axis illumination (ONI) mode is achieved. The ONI mode may be achieved by a mechanism, like an aperture with a certain pattern, such as dipole, quasar, or disk, constructed according to various examples. The aperture is configured at the illuminator stage to achieve the ONI illumination mode. The incident light ray 70 from the illuminator 30, after being diffracted from the mask 45, is diffracted into various diffraction orders due to presence of these mask patterns, such as a 0-th diffraction order ray 71, a +1-st diffraction order ray 72 and a −1-st diffraction order ray 73 (as shown in FIG. 3).

Referring to FIG. 5, the method of 300 also includes an operation 308 by configuring the pupil filter 51 in the lithography system 10. The pupil filter 51 is configured in a pupil plane of the lithography system 10. In an image optical system, there is a plane with field distribution corresponding to Fourier Transform of object (the mask 45 in the present case). This plane is called pupil plane. The pupil filter is placed in the pupil plane to filter out specific spatial frequency components of the EUV light from the mask 45. A pattern defined in the pupil filter 51 is determined by the respective illumination mode. FIG. 2 illuminates examples of the pattern of the pupil filter 51. As discussed above, in the present example, the mask 45 includes a defect such as a bump or pit. Any adverse effects from the defect are reduced and/or eliminated by the disk illuminator 30 using a nearly complete on-axis illumination (ONI) with partial coherence σ smaller than 0.3, and the pupil filter 51. This is because the opaque regions 51B of the pupil filter 51 blocks a portion of the light diffracted from the defect region in the mask 45, thereby reducing and/or eliminating the printability of the defect on the target 65.

Referring to FIG. 5, the method 300 proceeds to operation 310 by performing a lithography exposure process to the target 65 in the configured illumination mode and the pupil filter 51. The EUV light from the radiation source 20 is modulated by the illuminator 30 with the EUV energy distribution for the on-axis illumination, directed from the mask 45, and further filtered by the pupil filter 51, the EUV light images the IC pattern of the mask 45 to the target 65.

Additional steps can be provided before, during, and after the method 300, and some of the steps described can be replaced, eliminated, or moved around for additional embodiments of the method 300.

Based on the above, the present disclosure presents an EUV lithography system and process that employs a nearly complete on-axis illumination (ONI) with partial coherence σ smaller than 0.3, to expose an EUV mask to produce diffracted light and non-diffracted light. The EUV lithography system and process also employs a pupil filter, configured such that its light-transmitting region is defined by the position of diffracted light (PDL) on a pupil plane to transmit light diffracted from the pattern of a mask and rest of its regions is set to an opaque region to block light diffracted from non-pattern, such as a defect. The EUV lithography system and process can therefore employ an EUV mask having defect regions. The EUV lithography system and process demonstrates significantly reducing defect printability.

The present disclosure is directed towards lithography system and processes. In one embodiment, an extreme ultraviolet lithography (EUVL) system and process includes providing a patterned mask and receiving information of a position of diffraction light (PDL), diffracted from the patterned mask on a pupil plane of a projection optics box (POB). The EUVL system and process also includes exposing the patterned mask by an on-axis illumination (ONI) with partial coherence σ less than 0.3. The EUVL system and process also includes utilizing a pupil filter to control light intensity distribution diffracted from the patterned mask. The pupil filter has a light-transmitting region defined by the PDL and rest area of the pupil filter is set to be an opaque region. The EUVL system and process also includes collecting and directing the diffracted light from the patterned mask to expose a target.

In another embodiment, an extreme ultraviolet lithography (EUVL) system and process includes receiving a mask for EUVL. The mask includes a substrate having a first region and a second region, a multilayer mirror above the first and second regions, an absorption layer above the multilayer mirror in the second region and a resultant phase-defect region in the first region. The EUVL system and process also includes providing information of a position of diffraction light (PDL), diffracted from the mask on a pupil plane of a projection optics box (POB). The EUVL system and process also includes exposing the mask by an on-axis illumination (ONI) with partial coherence σ less than 0.3, utilizing a pupil filter to control light intensity distribution diffracted from the mask. The pupil filter includes a light-transmitting region defined by the PDL and rest of areas of the pupil filter is set to be an opaque region. The EUVL system and process also includes collecting and directing the diffracted light from the patterned mask to expose a target.

In yet another embodiment, an EUVL process includes receiving a patterned mask having one dimension patterns, providing a dipole illumination with partial coherence σ less than 0.3 and providing a pupil filter having a light-transmitting region defined by a position of diffracted light (PDL) diffracted from the patterned mask on a pupil plane and an opaque region set to rest of areas of the pupil filter. The EUVL process also includes exposing the mask by the dipole illumination and collecting diffracted light transmit through the pupil filter and directing the diffracted light to expose a target.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) process, comprising:
   providing a patterned mask including a phase-defect region;
   receiving information of a position of diffraction light (PDL), diffracted from the patterned mask on a pupil plane of a projection optics box (POB);
   exposing the patterned mask by an on-axis illumination (ONI) with partial coherence σ less than 0.3;
   utilizing a pupil filter to control light intensity distribution diffracted from the patterned mask, the pupil filter including:
      a light-transmitting region defined by the PDL; and
      rest of areas of the pupil filter set to be an opaque region;
   compensating, by the pupil filter, for a phase error caused by the phase-defect region at a time of exposure of the patterned mask; and
   collecting and directing the diffracted light from the patterned mask to expose a target.

2. The process of claim 1, wherein the light-transmitting region of the pupil filter is further defined by an additional area surrounding the PDL.

3. The process of claim 1, wherein the pupil filter blocks an amount of reflection light, diffracted from the mask, to expose the target.

4. The process of claim 3, wherein the pupil filter is set according to an illumination mode of the ONI.

5. The process of claim 1, wherein the patterned mask includes:
   a low thermal expansion material (LTEM) substrate;
   a reflective multilayer (ML) above a surface of the LTEM substrate;
   a conductive layer above an opposite surface of the LTEM substrate;
   a capping layer above the reflective ML;
   a buffer layer above the reflective ML layer; and
   an absorption layer above the buffer layer.

6. The process of claim 5, wherein the patterned mask includes:
   an absorptive region configured as (from top to bottom) the absorption layer layer/the buffer layer/the capping layer/the reflective ML/the LTEM substrate;
   a reflective region configured as (from top to bottom) the buffer layer/the capping layer/the reflective ML/the LTEM substrate; and
   the phase-defect region inside the reflective region.

7. The process of claim 6, wherein the phase-defect region results from a defect underneath the reflective ML layer.

8. The process of claim 6, wherein the phase-defect region results from a defect embedded in the reflective ML layer.

9. An extreme ultraviolet lithography (EUVL) process, comprising:
   receiving a mask for EUVL, the mask includes:
      a substrate including a first region and a second region;
      a multilayer mirror above the first and second regions;
      an absorption layer above the multilayer mirror in the second region; and
      a resultant phase-defect region in the first region;
   providing information of a position of diffraction light (PDL), diffracted from the mask on a pupil plane of a projection optics box (POB);
   exposing the mask by an on-axis illumination (ONI) with partial coherence σ less than 0.3;
   utilizing a pupil filter to control light intensity distribution diffracted from the mask, the pupil filter including:
      a light-transmitting region defined by the PDL; and
      rest of areas of the pupil filter set to be an opaque region, wherein the pupil filter compensates for the resultant phase-defect region at a time of exposure of the mask; and
   collecting and directing the diffracted light from the patterned mask to expose a target.

10. The process of claim 9, wherein the light- transmitting region of the pupil filter is further defined by an additional area surrounding the PDL.

11. The process of claim 9, wherein the pupil filter blocks an amount of reflection light, diffracted from the mask, to expose the target.

12. The process of claim 9, wherein the resultant phase-defect region results from a defect underneath the reflective ML layer.

13. The process of claim 9, wherein the resultant phase-defect region results from a defect embedded in the reflective ML layer.

14. An extreme ultraviolet lithography (EUVL) system, comprising:
   a patterned mask having one dimensional patterns, the patterned mask including a phase-defect region;
   a dipole illumination with partial coherence σ less than 0.3 for exposing the mask;
   a pupil filter having a light-transmitting region defined by a position of diffracted light (PDL) diffracted from the patterned mask on a pupil plane and an opaque region set to rest area of the pupil filter; and optics configured to collect diffracted light transmitted through the pupil filter and direct the diffracted light to expose a target, wherein the pupil filter compensates for the phase-defect region during the exposing of the patterned mask.

15. The system of claim 14, wherein the patterned mask includes:

a low thermal expansion material (LTEM) substrate;

a reflective multilayer (ML) above a surface of the LTEM substrate;

a conductive layer above an opposite surface of the LTEM substrate;

a capping layer above the reflective ML;

a buffer layer above the reflective ML layer; and an absorption layer above the buffer layer.

16. The system of claim 15, wherein the patterned mask includes:

an absorptive region configured as (from top to bottom) the absorption layer layer/the buffer layer/the capping layer/the reflective ML/the LTEM substrate;

a reflective region configured as (from top to bottom) the buffer layer/the capping layer/the reflective ML/the LTEM substrate; and the phase-defect region inside the reflective region.

17. The system of claim 16, wherein the phase-defect region results from a defect underneath the reflective ML layer.

18. The system of claim 16, wherein the phase-defect region results from a defect embedded in the reflective ML layer.

19. The system of claim 14, wherein the pupil filter blocks an amount of reflection light, diffracted from the mask, to expose the target.

20. The system of claim 14, wherein the light-transmitting region of the pupil filter is further defined by an additional area surrounding the PDL.

* * * * *